(12) United States Patent
Pinneo

(10) Patent No.: US 6,523,259 B1
(45) Date of Patent: Feb. 25, 2003

(54) METHOD OF MANUFACTURING A HEAT PIPE

(75) Inventor: John Michael Pinneo, Portola Valley, CA (US)

(73) Assignee: P1 Diamond, Inc., Santa Clara, CA (US)

( * ) Notice: Subject to any disclaimer, the term of this patent is extended or adjusted under 35 U.S.C. 154(b) by 0 days.

(21) Appl. No.: 09/909,053

(22) Filed: Jul. 18, 2001

Related U.S. Application Data

(62) Division of application No. 09/699,035, filed on Oct. 27, 2000.
(60) Provisional application No. 60/162,511, filed on Oct. 29, 1999.

(51) Int. Cl.⁷ ................................................. B23P 15/26
(52) U.S. Cl. ............................ 29/890.032; 29/890.03; 165/104.21; 165/104.26; 165/133
(58) Field of Search ....................... 29/890.032, 890.03; 165/185, 104.21, 104.26, 133

(56) References Cited

U.S. PATENT DOCUMENTS

| | | | | |
|---|---|---|---|---|
| 5,077,103 A | * | 12/1991 | Wagner et al. | 165/104.14 |
| 5,150,748 A | * | 9/1992 | Blackmon et al. | 165/181 |
| 5,451,352 A | * | 9/1995 | Cook | 264/102 |
| 5,485,671 A | * | 1/1996 | Larson et al. | 165/104.19 |
| 5,566,752 A | * | 10/1996 | Arnold et al. | 165/104.33 |
| 5,766,691 A | * | 6/1998 | Arnold et al. | 165/104.33 |
| 5,801,486 A | * | 9/1998 | Johnson et al. | 313/309 |
| 5,825,624 A | * | 10/1998 | Arnold et al. | 165/185 |
| 5,947,193 A | * | 9/1999 | Adkins et al. | 165/104.26 |
| 6,065,529 A | * | 5/2000 | Antoniuk et al. | 165/104.26 |
| 6,302,192 B1 | * | 10/2001 | Dussinger et al. | 165/104.21 |

* cited by examiner

*Primary Examiner*—I Cuda-Rosenbaum
(74) *Attorney, Agent, or Firm*—Sierra Patent Group, Ltd.

(57) ABSTRACT

A heat pipe has at least one diamond element through which at least a portion of heat flowing into the heat pipe passes.

10 Claims, 3 Drawing Sheets

FRONT VIEW

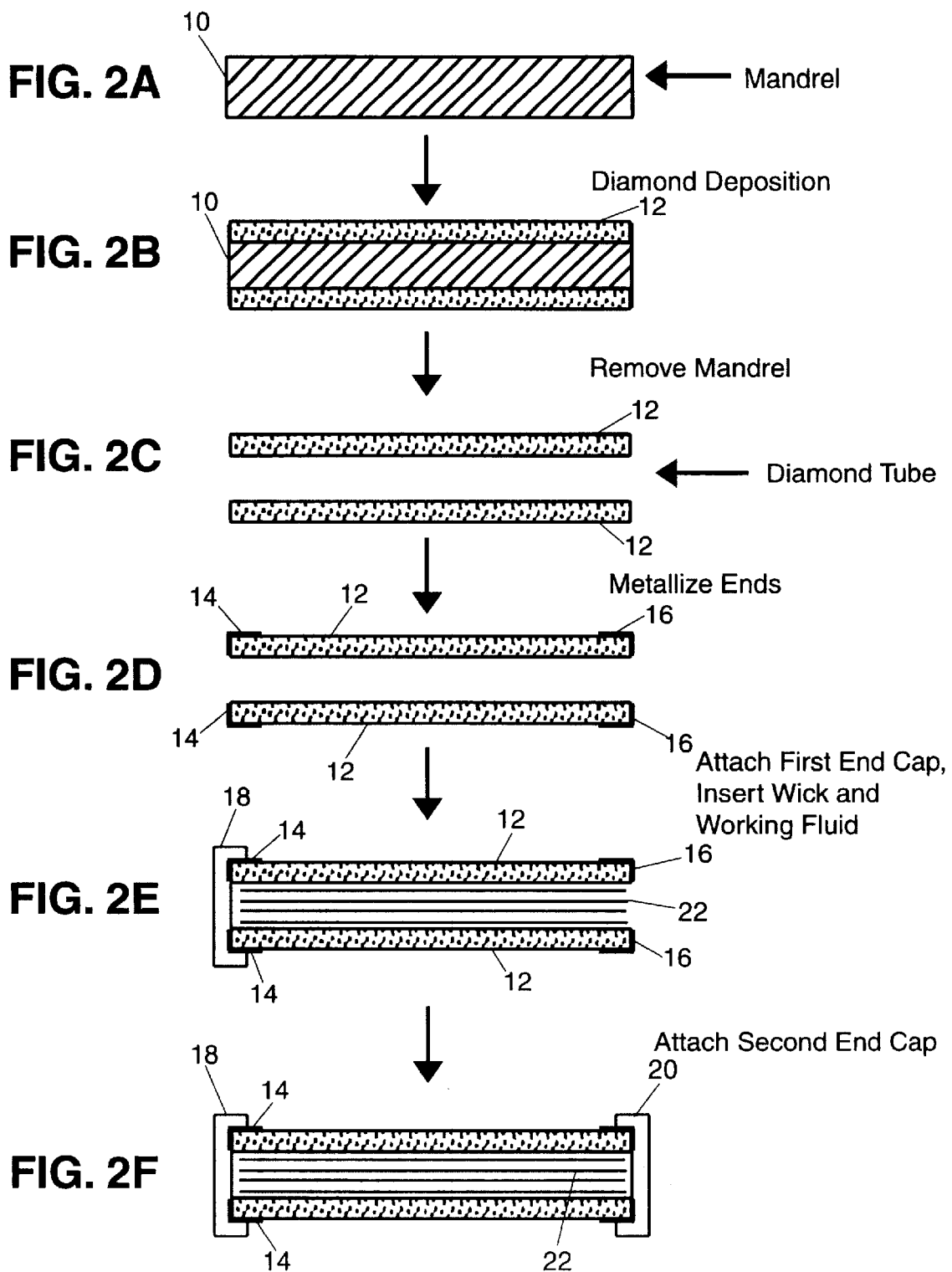

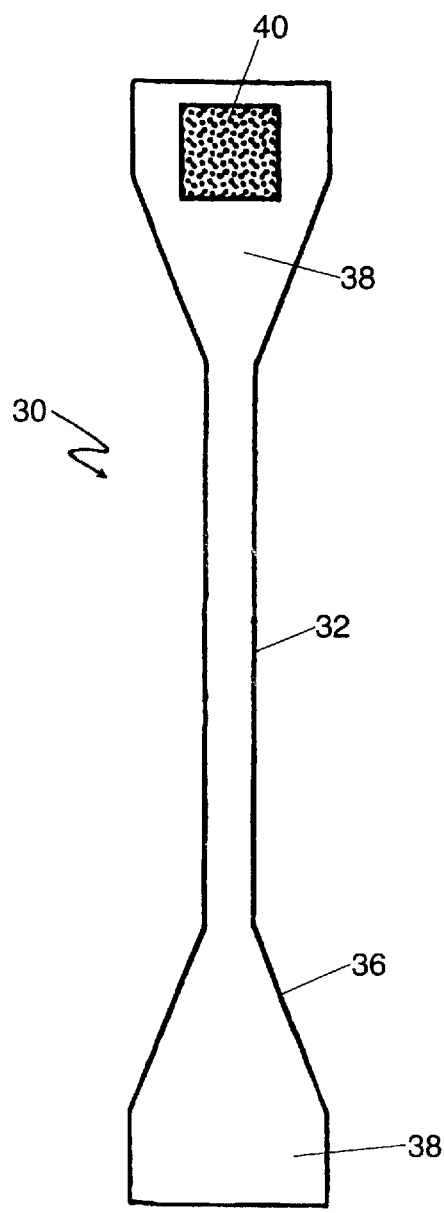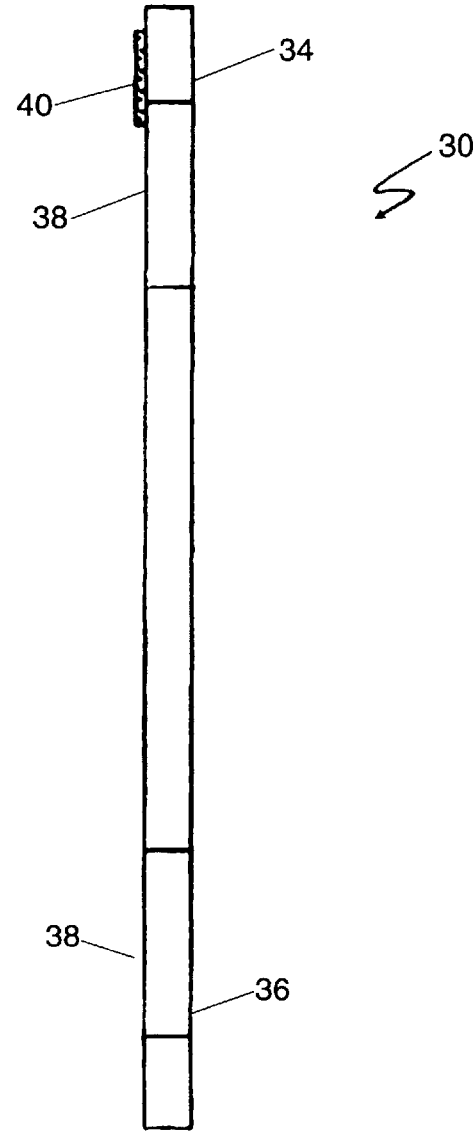
FRONT VIEW
FIG. 3A
SIDE VIEW
FIG. 3B

METHOD OF MANUFACTURING A HEAT PIPE

RELATED APPLICATIONS

This application is a Divisional of co-pending U.S. patent application Ser. No. 09/699,035, filed Oct. 27, 2000, which claims priority from Provisional Patent Application serial No. 60/162,511, filed Oct. 29, 1999.

BACKGROUND OF THE INVENTION

1. Field of the Invention

The present invention relates to heat transfer components. More particularly, the present invention relates to heat pipes and to heat pipes employing diamond components therein to improve the properties of heat pipes with respect to their thermal transfer performance and other characteristics.

2. The Prior Art

Heat pipes are well-known devices that effect the transport of heat from a source to a sink with very high efficiency and power handling capacity compared to heat transfer through ordinary solid components. Heat pipes commonly consist of a closed plenum, or space, said space being partially filed with a substance or heat exchange medium (a working fluid) which is a liquid at the temperature of the cooler end (heat sink region) of the heat pipe and which is a gas at the temperature of the warmer end (heat source region) of the heat pipe.

The plenum is often also partially occupied by a fibrous material that serves as a capillary mass that effects transport of liquid heat exchange medium from the heat sink region to the heat source region, at which the liquid heat exchange medium vaporizes, absorbing heat from the heat source, and is then transported by means of its own pressure to the heat sink region, at which it recondenses to a liquid, yielding up its heat of vaporization and effecting transport of heat energy from the heat source to the heat sink. Capillary action then transports the condensed heat exchange medium back to the heat source to renew the cycle. A schematic view of a heat pipe and its operation is presented in FIG. 1.

Because of the relatively large amount of heat that is required to drive the continuous vaporization and condensation cycle, heat pipes can exhibit an effective thermal conductivity of over 100 times that of any known bulk material. By suitable choice of structural materials, heat exchange fluids, and capillary materials, heat pipes have been made to operate at temperatures ranging from cryogenic to 2000 degrees Centigrade. Their excellent thermal transport properties and mechanical simplicity have led to their widespread adoption in thermal management systems that require efficient transport of heat from sources to sinks.

A specific example of heat pipe utility is their employment in laptop and similarly thermally constrained computer systems. Microprocessors and their ancillary integrated circuits generate heat during operation. In general, the faster such devices operate, the more heat they generate. In computers that require high packaging densities to achieve small size, such as laptop personal computers, it is very difficult to provide for adequate heat rejection to maintain safe and reliable operation of microprocessors and other integrated circuits. Heat pipes have made a great contribution to solving this problem.

An increasing portion of laptop computers incorporate heat pipes to transport heat from the processor and other internal heat sources to a large-area heat sink that exchanges heat with surrounding air. As microprocessor heat loads increase, heat pipe technology becomes increasingly the thermal transport technology of choice, indeed the only practical technology, for maintaining processor temperatures within operating limits.

It is appreciated by those skilled in the art that heat energy, in order to be transported by the heat pipe, must first pass from its source, across the wall of the heat pipe, into the heat exchange fluid which then vaporizes to effect further transport of the heat energy. The heat must again pass across the wall of the heat pipe to the heat sink at the condensation (heat removal) end of the heat pipe. The walls of the heat pipe, being composed of materials having much lower thermal conductivity than the effective thermal conductivity of the heat exchange liquid/vapor phase change action, present a resistance to transfer of heat from the source to the working fluid. It is this critical wall thermal resistance towards which this invention is directed.

Thermal transport across the wall of a heat pipe is a direct function of the thermal conductivity of the wall material. This drives toward selection of a high thermal conductivity material, such as copper or silver, for use in the thermal transfer wall. However, the wall material must also be compatible with the contemplated operating temperature range, working fluid, and system components. This often dictates use of materials with inferior conductivity, such as steel, aluminum, or other material less desirable from a heat transfer perspective.

BRIEF DESCRIPTION OF THE PRESENT INVENTION

The present invention is a heat pipe employing diamond as the thermal transfer wall material through which heat is transported into and/or out of the heat pipe. Several improvements that are of great utility result from this invention which will be described below following a brief review of the properties of diamond that particularly suit it for this invention.

BRIEF DESCRIPTION OF THE DRAWING FIGURES

FIGS. 2A through 2F are cross-sectional views of a heat pipe according to a first embodiment of the present invention taken after selected steps in its fabrication process according to the present invention.

FIGS. 3A and 3B are a schematic front and side views of a heat pipe according to a second embodiment of the present invention.

DETAILED DESCRIPTION OF THE PRESENT INVENTION

Figure 1:
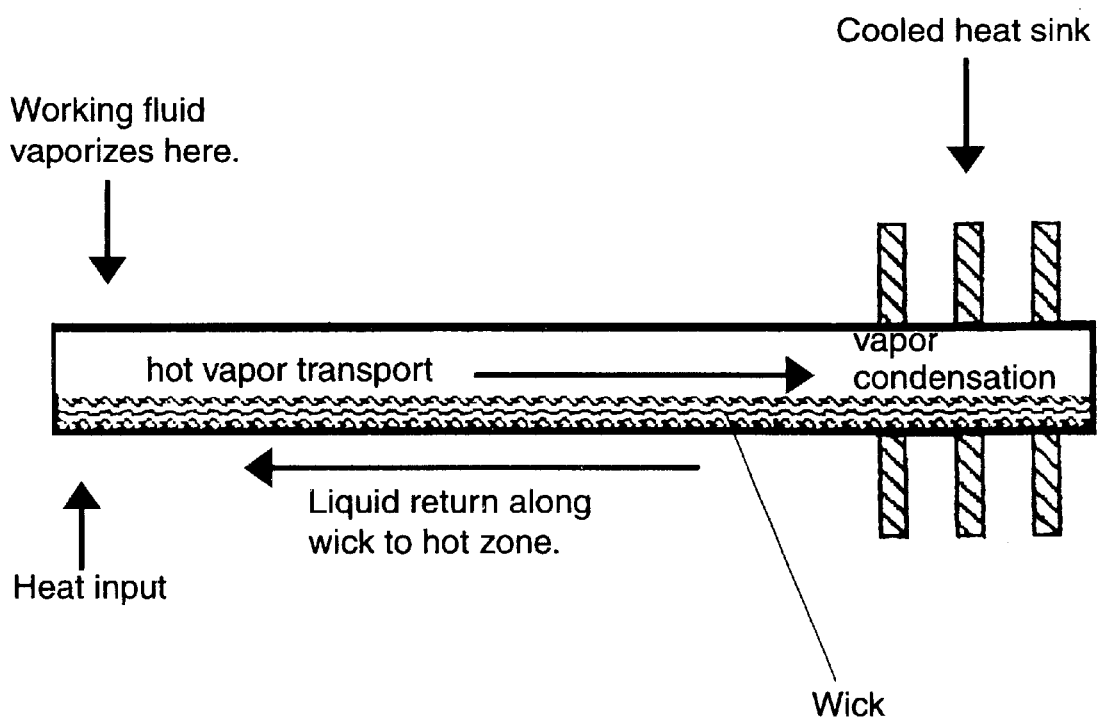
FIG. 1 is a schematic diagram showing a cross-sectional view of a prior-art heat pipe and its operation.

Those of ordinary skill in the art will realize that the following description of the present invention is illustrative only and not in any way limiting. Other embodiments of the invention will readily suggest themselves to such skilled persons.

Diamond exhibits the highest known bulk material thermal conductivity. Both natural and synthetic diamond have been measured at greater than 20 W/cm/° C. thermal conductivity. For comparison, the best metals, being silver, gold, and copper, all measure approximately 4 W/cm/° C. on this scale. Furthermore, the exceptional thermal conductivity of diamond is substantially isotropic, that is, there is no significant directional variation in thermal conductivity.

Diamond also exhibits the highest known thermal diffusivity, or speed of heat conduction, of any known material. This means that fast transient heat pulses can be absorbed and propagated away from their source by diamond more rapidly than with any other known material.

Diamond has a low thermal expansion coefficient, ranging between 1 to 2 parts per million per degree Centigrade over normal electronic operating temperatures. This provides a good thermal expansion match to important electronic materials such as silicon and gallium arsenide. It also confers on diamond a high degree of resistance to breakage induced by thermal gradients or thermal shock.

Diamond is inert to chemical attack by any known reagent at temperatures below approximately 400 degrees Centigrade. This renders diamond compatible with a wide range of heat pipe working fluids and with corrosive environments.

Diamond is the hardest and stiffest known material, giving it great structural integrity when subjected to forces either exogenously applied or generated by differential thermal expansion forces at interfaces between diamond bonded to other materials.

Diamond is an excellent electrical insulator, providing electrical isolation in particular applications that require that property. It can be rendered electrically conductive if needed by modifications to its synthesis process (doping with boron) or coating with thin metal layers using processes familiar to those skilled in the art.

Finally, diamond is non-toxic and is biocompatible, in contrast to beryllium oxide, a ceramic having good thermal conductivity that is sometimes used as a heat transfer material. If improperly fabricated or disposed of, beryllium oxide can induce berylliosis, an untreatable fatal disease.

The use of diamond in the present invention as a heat pipe wall material brings numerous benefits. First, heat flow from the source across the heat pipe wall to and from the internal working fluid is greatly improved, leading to enhanced heat transfer efficiency in operation of the heat pipe. Specifically, use of diamond (at a thermal conductivity of 20 W/cm/° C.) as a wall material rather than copper (at a thermal conductivity of 4 W/cm/° C.) in an otherwise identical configuration will provide up to (20/4) times, or 500%, better thermal conductance across the wall.

In addition, because of the superior mechanical properties of diamond, thinner walls may be used compared with lesser materials, increasing wall thermal conductance still further. For example, use of a diamond wall with thickness half that of the otherwise dimensionally identical copper wall will increase wall thermal conductance by two, or 200%. Note that this increase is multiplicative with the increase due to diamond's bulk thermal conductivity as compared with copper. Thus, the increase of 500% noted in the first benefit description above would increase to 1,000% if combined with one-half reduced wall thickness made possible by using diamond.

Use of diamond as the wall material can increase the amount of heat energy transported by the heat pipe. Because heat transfer across the wall is often so poor as to constitute the rate-limiting step in the overall operation of the heat pipe, the inherent capacity of the heat pipe's working fluid heat transport system is underutilized. Improved wall heat transfer couples additional heat into the working fluid, resulting in greater heat transport in underutilized heat pipes.

Use of diamond as a wall material not only can increase heat transport across the wall section, as described above, but can provide a lateral heat spreading function which can be very beneficial when removing heat from sources that exhibit strong thermal radients. For example, microprocessors exhibit "hot spots" (regions on the chip that run hotter than others). Often, it is the temperature of these hot spots that limits processor clock rate. If such a chip is closely coupled to a flat diamond element, such as may be used as a heat pipe wall, the high lateral thermal conductivity of diamond will reduce hot spot temperatures, allowing the device to be operated at higher clock rates. Note that this benefit derives from diamond's high isotropic thermal conductivity. Other materials, such as single-crystal graphite, are known to exhibit high thermal conductivity in one plane, but not others. These materials can only provide good heat transfer in one direction, and cannot simultaneously provide good longitudinal and lateral heat transport.

Use of diamond as a wall material at both ends of the heat pipe additionally increases heat transport by enhancing removal of heat from the heat pipe condensation end to the next element in the heat transport system. This is often the surrounding ambient air.

Referring now to FIGS. 2A through 2F in order, in one embodiment according to the present invention, a heat pipe is fabricated from a diamond tube. In the exemplary embodiment disclosed herein the dimensions given in order to understand the present invention are exemplary only and are not meant as limiting. Persons of ordinary skill in the art will appreciate that these dimensions are not critical and, in any event, may be scaled.

In a presently contemplated embodiment within the scope of FIG. 2, the diamond tube may have an outer diameter of 10 mm, an inner diameter of 9 mm, and a wall section thickness of 0.5 mm. The length of the tube may be 100 mm.

As may be seen from an examination of FIG. 2A, the tube is made by performing chemical vapor deposition of diamond on a mandrel 10, formed from a material such as molybdenum having an outer diameter of 9 mm and length 60 mm. The mandrel 10 has been prepared for diamond deposition by inducing nucleation through pre-deposition abrasion with diamond dust by means long established in the art of diamond chemical vapor deposition (CVD).

Referring now to FIG. 2B, the mandrel 10 is fixed within a diamond deposition system and is coated with diamond material 12 to a nominal thickness of 1 mm along its entire length, according to diamond CVD art well-known to the industry.

Referring now to FIG. 2C, following diamond deposition, the molybdenum mandrel 10 is removed using mixed nitric and hydrochloric acids or other chemical etchant capable of attacking and dissolving molybdenum. The diamond tube so formed is unaffected by the mandrel removal process. The ends of the diamond tube are trimmed to a uniform profile if needed using a Nd:YAG laser cutting system of the type commonly used to cut and process CVD diamond. FIG. 2C shows the structure of the diamond tube after removal of the mandrel and trimming of the tube ends.

Subsequent to end trimming of the tube, each end is metallized with a sequence of layered metals to prepare the ends of the tube for attachment of brazed or soldered end caps. A specific metallization sequence suitable for use in the present invention begins with a layer of about 200 Angstroms titanium deposited directly on the diamond. Next, 1000 Angstroms platinum is deposited over the titanium, followed by 10,000 Angstroms gold. The tube ends are metallized to a length on the outer diameter of at least about 5 mm from each end. FIG. 2D shows the structure of the diamond tube after deposition of the metallization layers 14 and 16 at the tube ends.

First and second metal caps 18, and 20 consisting of tungsten machined to fit closely but without significant interference over the diamond tube ends are procured and prepared for soldering or brazing. First cap 18 is fitted over one tube end and is soldered or brazed in place to the metallization region 14, using solder or braze formulations well known in the art.

A bundle 22 of clean, fine molybdenum wires of individual diameter not more than 0.01" is prepared such that the bundle has a length of not more than 100 mm and not less than 95 mm, with its aggregate cross-section area occupying between 10% and 75% of the 9 mm inner diameter of the diamond tube. The wire bundle 22 is inserted into the diamond tube to its full extent.

The diamond tube is then charged through its open end with heat exchange fluid, being in this instance, distilled water. The volume of the working fluid is not less than 1 cubic centimeter, and not more than 2 cubic centimeters. The diamond tube is oriented vertically with its open end up. FIG. 2E shows the structure of the diamond tube after attaching the first end cap 18, inserting wire bundle 22, and charging the tube through its open end with heat exchange fluid.

Subsequently, the second end cap 20 is fixed to the open end and soldered or brazed in place to the metallization region 16 as was the case with first end cap 18. This completes the fabrication of the heat pipe as shown at FIG. 2F.

The heat pipe may then be connected to a test fixture consisting of an electrical heat source with a maximum temperature of 125 degrees Centigrade and a copper heat sink cooled with circulating water having a temperature of 20 degrees Centigrade, both heat source and heat sink being sized to deliver and remove, respectively, up to 1 kW of thermal power. One end of the diamond tube is secured to the heat source, while the other end is secured to the cooled heat sink. In operation, heat transfer through the diamond heat pipe is found occur at a level exceeding 240% of that of a tube of otherwise identical construction made from copper.

According to a second embodiment of a heat pipe according to the present invention as shown in FIGS. 3A and 3B, a rectangular heat pipe is constructed from copper or other suitable material such as aluminum, with a working fluid consisting of water and with a compatible capillary fiber material as is well known in the art of heat pipe construction. As with the previous embodiment of the present invention disclosed herein, the dimensions given in order to understand the present invention are exemplary only and are not meant as limiting. Persons of ordinary skill in the art will appreciate that these dimensions are not critical and, in any event, may be scaled.

The heat pipe 30 has a length of 12", comprising a center section 32 with two widened end regions 34 and 36 consisting of cross-section dimensions 2" wide×0.5" high, these widened end regions 34 and 36 extending toward each other for a length of 1 inch, after which the width of the heat pipe is reduced over a distance of 2" to a value of 0.5", resulting in a cross-section of 0.5" wide×0.5" high throughout the 6"-long constant-section region 32 of the heat pipe.

The heat pipe 30 presents at least one planar surface 38 exhibiting dimensions of 1"×1". A square hole (not shown) is cut into this planar surface, the hole centered on the 1"×1" surface and having dimensions of 0.75"×0.75". Following this operation, the heat pipe is checked for adequate working fluid fill, which is replenished if needed, and the heat pipe is clamped such that the square hole is oriented horizontal, facing up.

A diamond wall element 40 is prepared consisting of a solid slab of diamond having dimensions 0.9"×0.9"×0.3 mm. One major face of this diamond wall element 40 is metallized as described earlier to accept solder or braze attachment. The diamond wall element 40 is centered on the hole with the metallized face in opposition to the heat pipe 30 and is soldered or brazed around its entire periphery to the heat pipe 30. This completes the integration of the diamond wall element into the heat pipe.

The heat pipe 30 with diamond wall element 40 is integrated into a test apparatus which comprises suitable mechanical supports, an electrical heat source having a planar element of major dimensions 0.5"×0.5", the surface being adequately flat to provide intimate physical and thermal contact when brought into juxtaposition with the diamond heat pipe wall element. The other end of the heat pipe is fixed to a cooled heat sink of temperature 20 degrees Centigrade adequate to absorb heat energy transported through the heat pipe. Power is applied to the heater in contact with the diamond wall element such that the heater assumes a temperature of approximately 125 degrees Centigrade. Thermal power transport through the heat pipe is found to exceed 175% of that observed with an otherwise identical heat pipe using a 75% tungsten, 25% copper heat spreader alloy as the wall element into which the heater power is coupled.

The present invention contemplates the use of multiple diamond heat pipe wall elements 40 at multiple positions in an extended heat pipe like that of FIGS. 3A and 3B, providing heat removal from multiple heat sources with a single heat pipe.

The present invention further contemplates use of diamond heat pipe wall elements 40 at hot and cold zones of the heat pipe 30, thereby to improve heat transport across the wall at both sites.

The present invention further contemplates use of diamond wall elements 40 in heat pipes 30 that are employed to promote enhanced thermal uniformity in addition to, or in place of, transport of heat from a source to a sink.

The present invention contemplates use of diamond wall elements 40 in heat pipes 30 without limitation as to the particular shape, geometry, or topology of the heat pipe or diamond wall element that may be imposed by engineering requirements. In this respect, persons of ordinary skill in the art will recognize that the embodiments disclosed herein are merely illustrative and not limiting, especially as to design details such as shape and geometry.

The present invention contemplates use of diamond wall elements 40 in heat pipes 30 without limitation as to the operating temperature of either the heat source or the heat sink, provided those temperatures lie within the operational limits of the diamond wall element 30 and the remaining components and materials used in heat pipe 30.

The present invention contemplates use of diamond wall elements 40 in heat pipes 30 wherein the diamond wall elements 40 function to transport heat out of the heat pipe.

Persons of ordinary skill in the art will recognize the above recitations as being offered as extensions, not limitations, of the broad applicability of the present invention.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for fabricating a heat pipe comprising:

preparing a mandrel for diamond deposition by inducing nucleation thereon;

depositing diamond on said mandrel by chemical vapor deposition along substantially its entire length;

removing said mandrel to form a diamond tube having first and second ends;

preparing said first and second ends of said diamond tube for attachment of end caps;

attaching a first end cap over said first end of said diamond tube;

affixing into said diamond tube a bundle of clean, fine wires of individual diameter not more than 0.01" each wire having a length of between about 95% and about 100% of the length of said diamond tube, said bundle having an aggregate cross-sectional area occupying between 10% and 75% of an inner diameter of said diamond tube;

charging said diamond tube with heat exchange fluid; and attaching a second end cap over said first end of said diamond tube.

2. The method of claim 1 wherein preparing said first and second ends of said diamond tube for attachment of end caps comprises metallizing said first and second ends.

3. The method of claim 2 wherein metallizing said first and second ends comprises metallizing to a length on the outer diameter of said diamond tube of at least 5 mm from each of said first and second ends.

4. The method of claim 3 wherein metallizing said first and second ends comprises depositing titanium directly on said first and second ends, depositing platinum over said titanium, and depositing gold over said platinum.

5. The method of claim 4 where said titanium has a thickness in the range of about 200 Angstroms, said platinum has a thickness in the range of about 1,000 Angstroms, and said gold has a thickness in the range of about 10,000 Angstroms.

6. The method of claim 1 wherein attaching said first end cap and said second end cap is accomplished by a method chosen from brazing and soldering.

7. The method of claim 1 wherein charging said diamond tube with heat exchange fluid comprises charging with distilled water.

8. The method of claim 1 wherein charging said diamond tube with heat exchange fluid comprises charging with an amount of fluid equal to between about $1/6$ and $1/3$ the inside volume of said diamond tube.

9. The method of claim 1 wherein said clean, fine wires are formed from molybdenum.

10. A method for fabricating a heat pipe comprising:

forming a rectangular heat pipe having two widened end regions presenting at least one planar surface;

forming a hole into said planar surface;

forming a diamond wall element consisting of a solid slab of diamond having one major face of said diamond wall element metallized to accept solder or braze attachment; and attaching said diamond wall element around a periphery of said hole.

* * * * *